United States Patent Office 3,237,135 Patented Feb. 22, 1966

3,237,135

BRIDGE CIRCUIT ARRANGEMENT EMPLOYING VOLTAGE CONTROLLED CAPACITANCE FOR CORRECTIVE FREQUENCY REGULATION

Peter Schucht, Munich, Germany, assignor to Siemens & Halske Aktiengesellschaft, Berlin and Munich, a corporation of Germany

Filed Mar. 30, 1962, Ser. No. 183,888
2 Claims. (Cl. 334—15)

The invention disclosed herein is concerned with a circuit arrangement for corrective frequency regulation, employing a controllable reactance for changing the oscillation circuit capacitance of an oscillator which may be tuned through.

It is known to use in frequency regulation circuits, for corrective frequency regulation, silicon diodes as controllable reactances, which have in the blocking range a voltage dependent capacitance, by connecting such diodes in parallel to the oscillation circuit. However, the capacitive tuning combined with a likewise capacitive corrective tuning, has the drawback that the regulation range becomes strongly dependent on the frequency. The frequency alteration produced in a circuit extending in parallel to the tuning capacitor, by a capacitance change $\Delta C$, changes between the lowest frequency F1 and the highest frequency F2 of the tuning range as $(F2/F1)^3$. However, the frequency alteration changes with a corrective tuning capacitor, connected in series with the tuning capacitor, as $(F1/F2)^n$, the exponent depending thereby upon the use of further capacitances in the circuit.

It is also known to partially obviate the undesired frequency dependence by connecting a trimmer capacitor in series with the adjustable corrective tuning capacitor, which trimmer capacitor is mechanically coupled with the tuning capacitor.

Other known arrangements proposes to dispose a low pass filter ahead of the controllable reactance or to connect an inductance in parallel to the corrective tuning capacitor, and to couple this combination over a capacitor to the oscillation circuit. It is, aside from the fact that the use of auxiliary inductances may cause excitation of the oscillator at a wrong frequency, often impossible to realize the required L- and C-values for the latter circuit.

The above noted expedients are not adapted to produce a constant regulation range extending over a frequency range as great as would be desirable.

According to the present invention, the frequency dependence is avoided, by the use of simple means and avoidance of the drawbacks of the known circuits, by connecting a controllable reactance respectively in parallel to the tuning circuit or tuning capacitor, and connecting a further controllable reactance in series therewith, or connecting only one controllable reactance over a coupling capacitor in series with the tuning capacitor.

Taking into consideration all capacitances and reactances, respectively, as well as the switching capacitances and the parallel and series capacitors provided for the range limitation, it is possible, with appropriate dimensioning of the capacitance values and the control voltage which is for the reactances separately adjustable, to obtain a compensation of the frequency courses and a nearly constant regulation range.

A further advantageous embodiment of the invention requires only one controllable reactance, thereby employing a combination of capacitances so as to cause the controllable reactance, which is operative as a corrective tuning capacitor, to act as series capacitance as well as parallel capacitance, whereby the series circuit comprising the tuning capacitor and trimming capacitor forms with a series circuit comprising a controllable reactance and a further capacitor, a bridge circuit having a coupling capacitor disposed in the diagonal arm thereof.

Frequency regulation circuits of this kind are particularly adapted for oscillators which are over a great frequency range locked to a frequency raster in similar steps, the reliable functioning of the raster oscillators depending thereby substantially upon whether or not the catching and holding range of each locked position can be held at the same value. The requirement for holding the regulation range constant over the entire tuning range is met by the circuit according to the invention, with little expenditure, by using silicon diodes operating as controllable reactances.

Further details of the invention will appear from the description of two embodiments thereof which is rendered below with reference to the accompanying drawing.

Figure 1:
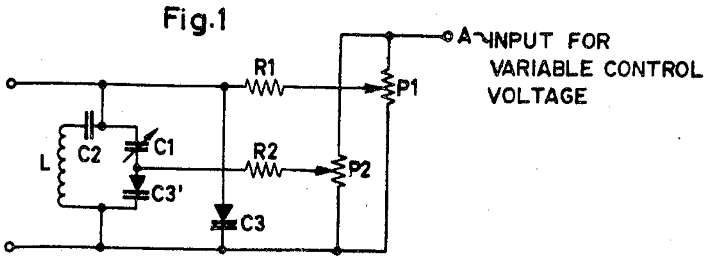
FIG. 1 shows an example of a frequency regulation circuit employing two controllable reactances.

Referring now to FIG. 1, the frequency of the oscillator which is to be regulated, is substantially determined by the coil L and the tunable capacitor C1. Controllable reactances, for example, silicon diodes C3 and C3′ are employed as corrective tuning capacitances for the corrective frequency regulation of the oscillator, the silicon diode C3 being thereby connected in parallel with the oscillation circuit, and the silicon diode C3′ being connected in series with the tuning capacitor C1. While a frequency course is obtained with a parallel reactance, which rises with rising frequency, and a falling frequency course with a series reactance, the oppositely acting frequency courses are compensated here by the use of a parallel and also a series reactance, to such an extent that there is produced a nearly constant regulation range over the entire frequency range.

A control voltage is conducted to the silicon diodes C3 and C3′, over the terminal A, such voltage constituting a component of a frequency regulation circuit. For better matching, the control voltage obtained at the potentiometers *p1* and *p2* can be conducted to the silicon diodes separately over the decoupling resistors R1 and R2. A decoupling capacitor C2 is provided between the connecting point of the tuning capacitor C1 with the silicon diode and the coil L, serving for the decoupling of the oscillation circuit and the regulation circuit. However, the decoupling capacitor C2 may likewise be disposed in the connection extending from the tuning capacitor C1 and the silicon diode C3. Owing to the relatively small capacitance variations which are obtainable with controllable reactance members, it may be necessary to employ in the oscillation circuit trimming capacitors which are to be connected, for example, in parallel to the silicon diode C3′ with the tuning capacitor C1 in series, or parallel to the oscillation circuit. In view of the use of such trimming capacitors, the capacitance variations of the tuning capacitor C1 are dimensioned so that the desired frequency course is preserved.

Figure 2:
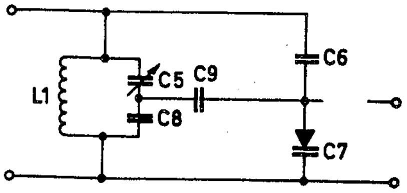
FIG. 2 represents an example of a frequency regulation circuit employing only one controllable reactance operating in a bridge circuit.

FIG. 2 represents a particularly advantageous variant of the circuit shown in FIG. 1, requiring only one controllable reactance C7 which forms a bridge circuit with capacitors C5, C6 and C8. The coil L1 and the capacitors C5, C6, C7, C8 are the frequency determining elements of the oscillation circuit. The tuning capacitor C5 forms with the trimming capacitor C8 an arm of the capacitance bridge. The other bridge arm comprises the capacitor C6 and the reactance formed by a silicon diode C7. The capacitor C9 is disposed in the diagonal arm of the bridge. The four bridge arms are appropriately dimensioned so that the capacitor C9 in the diagonal arm of the bridge is without current about midway of the tuning range. At frequencies above this point, the current flowing through the silicon diode C7 will reach the capacitor C6. The controllable reactance C7 has in this range the function of a parallel capacitance, so that the frequency displacement grows with rising frequency. In the lower tuning range, the current flows into the silicon diode over the capacitor C9 disposed in the bridge diagonal, so that the silicon diode acts as a series capacitance, resulting in increase of the frequency displacement with falling frequency. The magnitude of the frequency displacement at the ends of the tuning range will remain exactly the same upon optimum dimensioning of the capacitor C9, the capacity of which influences the total frequency only negligibly.

Figure 3:
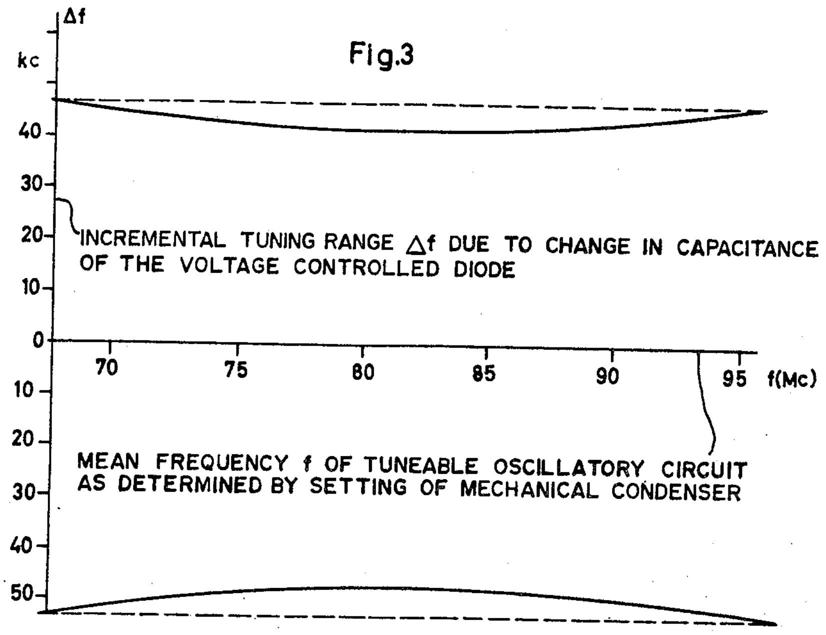
FIG. 3 is a graph illustrating the frequency displacement over the tuning range which is obtained by the controllable reactance.

The frequency displacement $\Delta f$ which is by the use of this circuit held nearly constant over a great frequency range, is plotted in FIG. 3 over the oscillator frequency $f$. The sagging of the curve which occurs midway of the tuning range, can be avoided, save for a small fraction, by appropriate dimensioning of the co-operatively involved capacitances.

The realization of the circuit according to the present invention is not inherently bound to the use of silicon diodes, as it can be equally successfully constructed with reactance tube circuits or appropriately circuited transistors. It is moreover possible to use diodes with angularly controlled current flow, which are circuited serially with fixed capacitances.

Changes may be made within the scope and spirit of the appended claims which define what is believed to be new and desired to have protected by Letters Patent.

I claim:

1. A circuit arrangement for automatic corrective frequency regulation of tunable oscillator circuits, the oscillating circuit capacitance of which is alterable by the use of capacitances which are controlled by control voltages, comprising in combination with an oscillator circuit, including an inductance, a variable capacitor in the oscillation circuit, and a controllable capacitance and three further capacitors connected together in a bridge network forming two series circuits extending parallel to the inductance, and a coupling capacitor connecting the center points of the two series circuits, the control voltage being extended to the two terminals of the controllable capacitance.

2. A circuit arrangement according to claim 1, wherein the bridge components are so proportioned that the bridge diagonal containing the coupling capacitor is without current approximately midway of the frequency course involved.

References Cited by the Examiner

UNITED STATES PATENTS 2,182,377 12/1939 Guanella ........... 332—20

ELI LIEBERMAN, acting *Primary Examiner.*

HERMAN KARL SAALBACH, *Examiner.*